(12) United States Patent  
Oh et al.

(10) Patent No.: US 12,237,035 B2  
(45) Date of Patent: Feb. 25, 2025

(54) SEMICONDUCTOR DEVICE AND RETENTION TEST METHOD

(71) Applicant: SAMSUNG ELECTRONICS CO., LTD., Suwon-si (KR)

(72) Inventors: Myeongjin Oh, Suwon-si (KR); Kyungjin Park, Suwon-si (KR); Yongsuk Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 136 days.

(21) Appl. No.: 18/113,165

(22) Filed: Feb. 23, 2023

(65) Prior Publication Data

US 2024/0161860 A1 May 16, 2024

(30) Foreign Application Priority Data

Nov. 16, 2022 (KR) .................. 10-2022-0153661

(51) Int. Cl.
*G11C 29/00* (2006.01)
*G11C 29/50* (2006.01)
*G11C 29/54* (2006.01)

(52) U.S. Cl.
CPC ........ *G11C 29/54* (2013.01); *G11C 29/50004* (2013.01)

(58) Field of Classification Search
CPC ......... G11C 29/44; G11C 29/808; G11C 7/22; G11C 11/4087; G11C 29/785; G11C 11/406; G11C 11/4085; G11C 13/00; G11C 13/0004; G11C 13/0061; G11C 13/0069; G11C 16/20; G11C 16/32; G11C 2013/0088; G11C 29/00; G11C 29/021; G11C 29/023; G11C 29/028; G11C 29/04; G11C 29/1201; G11C 29/48; G11C 29/50; G11C 29/781; G11C 29/787; G11C 29/81; G11C 7/1048; G11C 7/1057; G11C 7/1084; G11C 7/1096; G11C 8/08; G11C 8/12; G11C 8/14; G11C 11/40618; G11C 11/4076; G11C 11/408; G11C 11/4082; G11C 11/4091; G11C 16/12; G11C 16/30; G11C 16/34; G11C 17/16; G11C 17/18; G11C 2029/1202; G11C 2029/1204; G11C 2029/1802; G11C 2029/4402; G11C 2207/2281; G11C 29/006; G11C 29/025; G11C 29/12; G11C 29/18; G11C 29/42;

(Continued)

(56) References Cited

U.S. PATENT DOCUMENTS 6,249,468 B1  6/2001 Kan et al.
9,997,255 B2  6/2018 Sridhara
(Continued)

FOREIGN PATENT DOCUMENTS

JP  2000-215674 A  8/2000
JP  2013-127824 A  6/2013
KR  20200144461 A  12/2020

*Primary Examiner* — Thong Q Le

(74) *Attorney, Agent, or Firm* — Fish & Richardson P.C.

(57) ABSTRACT

A semiconductor device includes: a memory test circuit that outputs a fourth signal based on a logic level of a second signal corresponding to a first signal output by a host and a logic level of a third signal; a memory device that becomes active or inactive based on a logic level of the fourth signal; and a test logic that outputs the third signal and performs a retention test on the memory device based on the logic level of the second signal.

20 Claims, 17 Drawing Sheets

(58) Field of Classification Search
CPC ..... G11C 29/4401; G11C 29/52; G11C 29/76;
G11C 29/78; G11C 29/783; G11C
29/806; G11C 29/835; G11C 29/844;
G11C 29/846; G11C 5/025; G11C 5/04;
G11C 5/143; G11C 5/144; G11C 5/147;
G11C 7/1018
See application file for complete search history.

(56) References Cited

U.S. PATENT DOCUMENTS

| | | | |
|---|---|---|---|
| 10,096,354 B1 | 10/2018 | Chevallier et al. | |
| 10,878,891 B1 | 12/2020 | Goel et al. | |
| 11,249,680 B2 * | 2/2022 | Park | G11C 7/1084 |
| 2017/0243634 A1 | 8/2017 | Kohara | |
| 2020/0402570 A1 | 12/2020 | Goel et al. | |

* cited by examiner

SEMICONDUCTOR DEVICE AND RETENTION TEST METHOD

CROSS-REFERENCE TO RELATED APPLICATION

This application claims priority to and the benefit of Korean Patent Application No. 10-2022-0153661 filed in the Korean Intellectual Property Office on Nov. 16, 2022, the entire contents of which are incorporated herein by reference.

BACKGROUND

(a) Field

The present disclosure relates to a semiconductor device and a retention test method.

(b) Description of the Related Art

Semiconductor memory devices are generally classified into volatile memory devices and non-volatile memory devices. While the volatile memory devices lose stored data when they are turned off, the non-volatile memory devices may retain the stored data when they are turned off.

The volatile memory devices may be classified, depending on data storing methods, into static random access memories (SRAMs) for storing data by use of latches and dynamic random access memories (DRAMs) for storing data by use of capacitors. Particularly, the SRAMs have lower integration than the DRAMs and thus have less memory capacity. But as a configuration of a peripheral circuit is simple and the peripheral circuit is operable at high rates, they are generally used as cache memories of controllers.

To reduce power consumption of the SRAM, methods for operating the SRAM in a retention mode for maintaining data at a low voltage are researched.

SUMMARY

Some embodiments may provide a semiconductor device for testing retention of a memory device.

Some embodiments may provide a semiconductor device for removing a glitch component of a signal.

An embodiment of the present disclosure provides a semiconductor device including: a memory test circuit for outputting a fourth signal based on a logic level of a second signal corresponding to a first signal output by a host and a logic level of a third signal; a memory device becoming active or inactive based on a logic level of the fourth signal; and a test logic for outputting the third signal and performing a retention test on the memory device based on the logic level of the second signal.

Another embodiment of the present disclosure provides a semiconductor device including: a memory device including a memory cell array operated based on a first voltage for a data write period, operated based on a second voltage that is lower than the first voltage for a data retain period, and operated based on the first voltage for a data validate period and a peripheral circuit not operating on the data retain period; and a test logic for performing a retention test on the memory cell array for the data write period, the data retain period, and the data validate period.

Another embodiment of the present disclosure provides a method for testing retention, including: outputting a first-level signal to a memory device for a data write period and outputting the first-level signal to a test logic for performing a retention test on a memory cell array of the memory device to write a test pattern to the memory cell array; outputting a second-level signal that is different from the first-level signal to the memory device for a data retain period provided after the data write period and outputting the first-level signal to the test logic to allow the memory cell array to retain written data; and outputting the first-level signal to the memory device for a data validate period provided after the data retain period and outputting the first-level signal to the test logic to allow the test logic to read data written to the memory cell array and determine whether the data are identical with the test pattern.

DETAILED DESCRIPTION OF THE EMBODIMENTS

Figure 1:
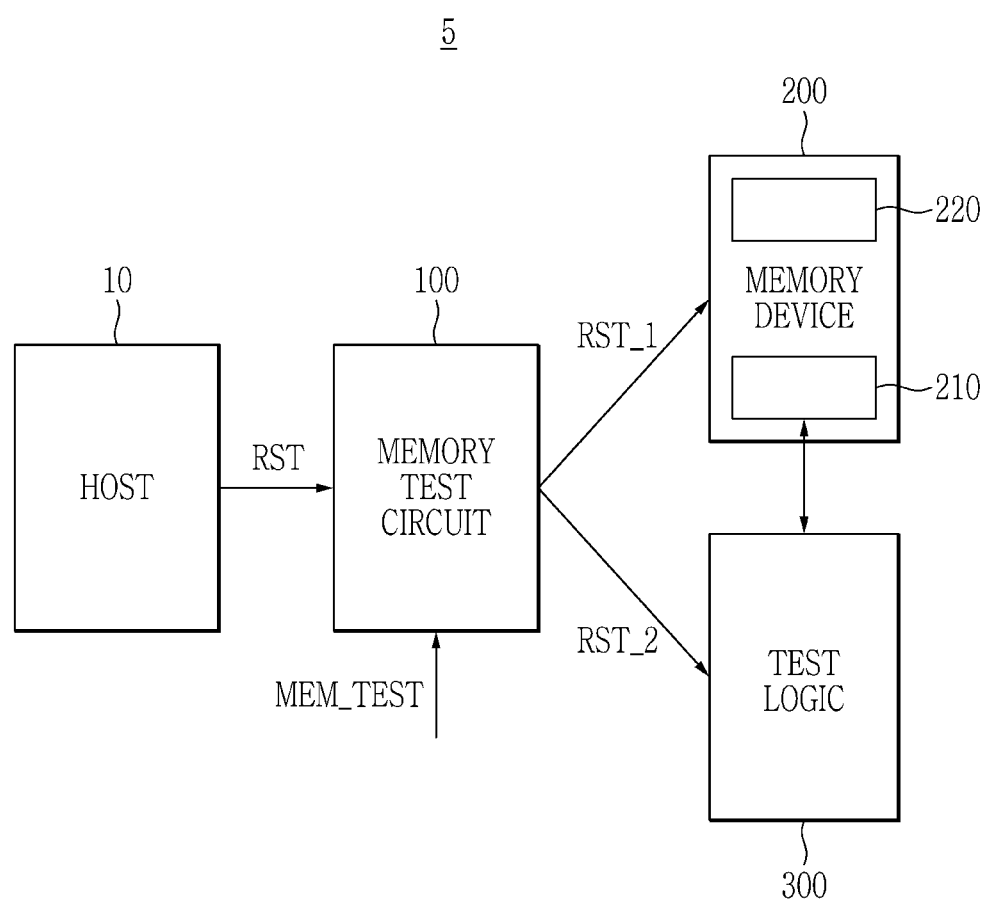
FIG. 1 shows a block diagram of a semiconductor device according to an embodiment.

In the following detailed description, only certain embodiments of the present disclosure have been shown and described, simply by way of illustration. As those skilled in the art would realize, the described embodiments may be modified in various ways, all without departing from the spirit or scope of the present disclosure.

Accordingly, the drawings and description are to be regarded as illustrative in nature and not restrictive and like reference numerals designate like elements throughout the specification. In the flowcharts described with reference to the drawings in this specification, the operation order may be changed, various operations may be merged, certain operations may be divided, and certain operations may not be performed.

Figure 2:
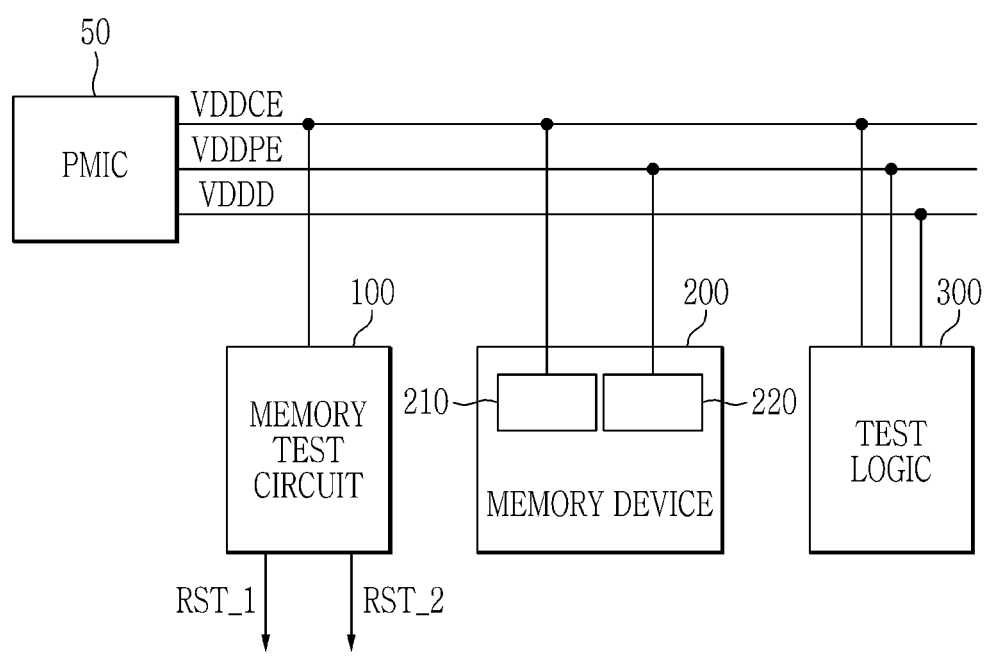
FIG. 2 shows supplying of power in a semiconductor device according to an embodiment.
Figure 3:
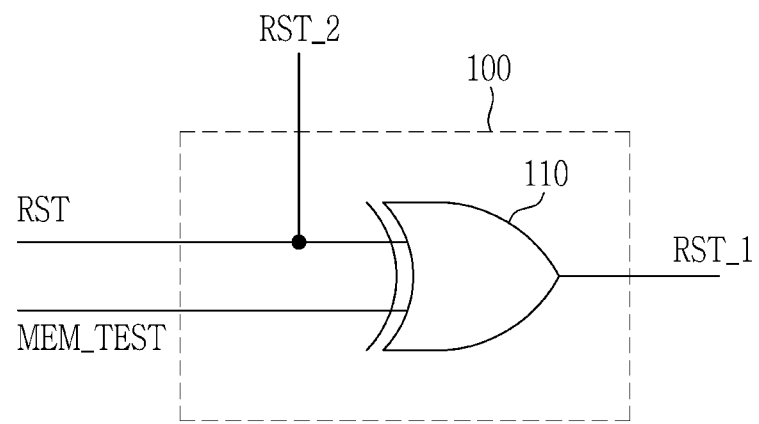
FIG. 3 shows a circuit diagram of a memory test circuit according to an embodiment.

FIG. 1 shows a block diagram of a semiconductor device according to an embodiment, FIG. 2 shows supplying of power in a semiconductor device according to an embodiment, and FIG. 3 shows a circuit diagram of a memory test circuit according to an embodiment.

Referring to FIG. 1, the semiconductor device 5 may include a host 10, a memory test circuit 100, a memory device 200, and a test logic 300.

The host 10 may be a central processing unit (CPU), a graphics processing unit (GPU), a microprocessor, or an application processor (AP).

The host 10 may test retention of the memory device 200 by using the memory test circuit 100 and the test logic 300. For example, the host 10 may output a signal RST for indicating an operation mode of the memory device 200 to the memory device 200. The signal RST may represent a shutdown signal for indicating an operation standby state. When the signal RST has a high level, it may indicate a communication mode of the memory device 200, and when the signal RST has a low level, it may indicate a retention mode of the memory device 200.

Regarding the existing semiconductor device having no memory test circuit 100, the memory device 200 and the test logic 300 receive the same signal RST from the host 10 so it is difficult to perform a retention test of the memory device 200 with a built-in self-test (BIST) logic of the test logic 300.

As the semiconductor device 5 may include the memory test circuit 100, the memory device 200 may receive a low-level signal RST_1, the test logic 300 may receive a high-level signal RST_2, and the BIST logic of the test logic 300 may perform a retention test to the memory device 200.

The memory test circuit 100 may output the signals RST_1 and RST_2 on the same or different logic levels to the memory device 200 and the test logic 300. The memory test circuit 100 may receive signals RST and MEM_TEST. For example, the memory test circuit 100 may receive the signal RST from the host 10. The signal MEM_TEST may allow the memory device 200 to enter a second retention mode. The second retention mode will be described later with reference to FIG. 3. The test circuit 100 may receive the signal MEM_TEST from the test logic 300. The test logic 300 may output the signal MEM_TEST after data are written to the memory device 200 during a retention test by the BIST logic. The BIST logic may generate a pattern by using logic having an algorithm, may write the pattern to the memory device 200, and may deduce a retention test result by using a comparator included in the BIST logic. Therefore, this may reduce the time, compared to the existing method of writing data to the memory device 200, reading the data from the same, outputting the read data to an external device (e.g., a test device disposed outside the sensor that is not a CMOS image sensor (CIS)), and performing a comparison task. The test circuit 100 may receive the signal MEM_TEST through a test pin terminal.

The memory test circuit 100 may output signals RST_1 and RST_2 based on the logic levels of the signals RST and MEM_TEST. Depending on an embodiment, the logic levels of the signals RST_1 and RST_2 may be identical to each other or different from each other. For example, the memory test circuit 100 may output a low-level signal RST_1 so that the memory device 200 may be inactive and it may output a high-level signal RST_2 so that the test logic 300 may perform a retention test of the memory device 200.

In a conventional way, the memory device 200 and the test logic 300 received the signals RST_1 and RST_2 with the same logic level from the host so they are simultaneously turned on or off. The memory test circuit 100 may output different signals RST_1 and RST_2 so that when the memory device 200 becomes inactive (e.g., a low power state), the test logic 300 may be continuously operable to perform a test on the memory device 200.

The memory device 200 includes a memory cell array 210 for storing data and a peripheral circuit 220 for controlling the memory cell array 210. Different voltages may be supplied to the memory cell array 210 and the peripheral circuit 220.

The memory cell array 210 may include a plurality of bit cells disposed in a matrix format having rows and columns. The memory device 200 may be an SRAM device.

The test logic 300 may become active and perform a retention test when the signal RST_2 has the high level and it may become inactive when the signal RST_2 has the low level. As an option, the test logic 300 may become active when the signal RST_2 has the low level and it may become inactive when the signal RST_2 has the high level.

The test logic 300 may include a BIST logic for testing retention of the memory cell array 210. Depending on embodiments, the test logic 300 may further include another logic in addition to the BIST logic for a test.

Referring to FIG. 2, the memory test circuit 100, the memory device 200, and the test logic 300 may receive voltages from a power management integrated circuit PMIC 50. The PMIC 50 may output voltages VDDCE, VDDPE, and VDDD according to an instruction of the host 10. Depending on embodiments, the PMIC 50 may be realized to be plural.

The memory test circuit 100 may receive the voltage VDDCE from the PMIC 50. The memory test circuit 100 may output the signals RST_1 and RST_2 by using the voltage VDDCE.

Regarding the memory device 200, the memory cell array 210 may receive the voltage VDDCE from the PMIC 50. The memory cell array 210 may perform program, erase, and read operations using the voltage VDDCE.

Regarding the memory device 200, the peripheral circuit 220 may receive the voltage VDDPE from the PMIC 50. The peripheral circuit 220 may control the memory cell array 210 using the voltage VDDPE.

The test logic 300 may receive the voltage VDDD from the PMIC 50. The test logic 300 may perform a retention test of the memory cell array 210 using the voltage VDDD.

The supplied voltage may be changed when the test logic 300 performs a retention test. For example, while the test logic 300 receives the voltage VDDD and is operated, it may receive the voltage VDDCE or the voltage VDDPE and may perform a retention test. The test logic 300 may include a switch and may receive one of the voltages VDDCE, VDDPE, and VDDD. The voltage VDDD may be output at the same power with at least one of the voltage VDDCE and the voltage VDDPE.

Depending on embodiments, the PMIC 50 may individually provide the voltage to the constituent elements. For example, the PMIC 50 may independently supply the voltage VDDCE to the memory test circuit 100 and the memory cell array 210. That is, the PMIC 50 may supply the voltage VDDCE to the memory test circuit 100 and may not supply the voltage VDDCE to the memory cell array 210. Further, the PMIC 50 may supply the voltage VDDCE to the memory cell array 210 and may not supply the voltage VDDCE to the memory test circuit 100. The PMIC 50 may include a switch for individually providing the voltage.

FIG. 2 shows that, for better understanding and ease of description, the PMIC 50 outputs three voltages VDDCE, VDDPE, and VDDD. Without being limited thereto, the PMIC 50 may be realized to further output voltages that are different from the voltages VDDCE, VDDPE, and VDDD.

Referring to FIG. 3, the memory test circuit 100 may include an exclusive OR (XOR) gate 110. The XOR gate 110 may perform an XOR operation on the signals RST and MEM_TEST and may output the signal RST_1.

A truth table of the XOR gate 110 may be expressed as in Table 1.

TABLE 1

| RST/RST_2 | MEM_TEST | RST_1 |
|---|---|---|
| H | L | H |
| L | L | L |
| H | H | L |

In Table 1, 'H' may indicate a high level, and 'L' may indicate a low level.

The signal RST_2 may be substantially equivalent to the signal RST.

The semiconductor device 5 may be operable according to the logic level output by the memory test circuit 100. For example, when the signal RST is high level, the signal MEM_TEST is low level, the signal RST_1 is high level, and the signal RST_2 is high level, the semiconductor device 5 may be operated in a normal mode for writing data to the memory device 200, reading the data of the memory device 200, or erasing the data.

When the signal RST is low level, the signal MEM_TEST is low level, the signal RST_1 is low level, and the signal RST_2 is low level, the semiconductor device 5 may be operated in a first retention mode. When the semiconductor device 5 is turned on and the system is reset in ordinary use, a set file may be written to the memory device 200. The set file may include firmware data and tuning data for performing operations according to the instructions of the host 10. A mode for the memory device 200 to retain the written set file may be referred to as a first retention mode.

When the signal RST is high level, the signal MEM_TEST is high level, the signal RST_1 is low level, and the signal RST_2 is high level, the semiconductor device 5 may be operable in a second retention mode. The second retention mode may test retention of the memory device 200 after the semiconductor device 5 is manufactured in a factory. In the second retention mode, the memory device 200 may retain a test pattern written for the test.

When the test logic 300 determines the memory device 200 to have a defect in the retention test, the test logic 300 may use built-in redundancy analysis (BIRA). For example, the test logic 300 may replace the memory cell having a defect with a redundancy memory cell. Here, the replacement may represent a logical replacement of address and not a physical replacement of address.

Figure 4:
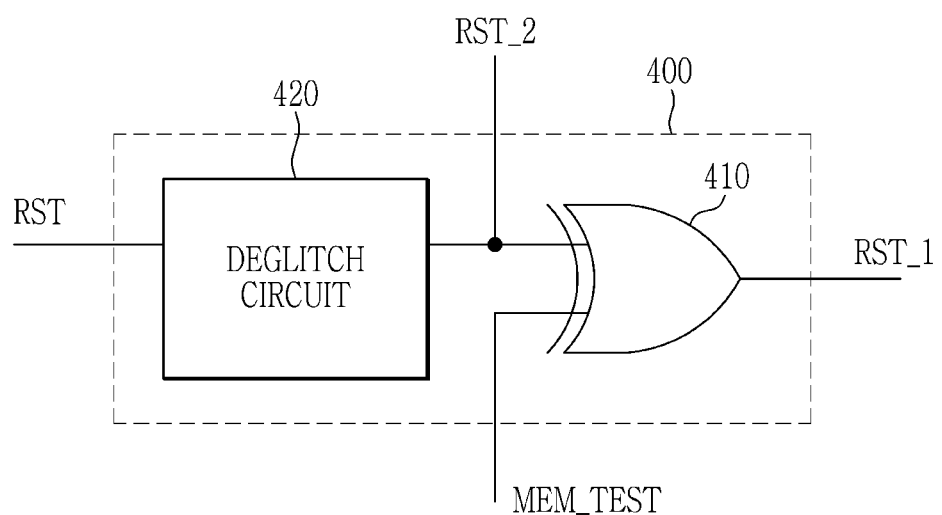
FIG. 4 shows a circuit diagram of a memory test circuit according to an embodiment.

FIG. 4 shows a circuit diagram of a memory test circuit according to an embodiment.

Referring to FIG. 4, the memory test circuit 400 may include an XOR gate 410 and a deglitch circuit 420. The XOR gate 410 may have substantially equivalent configurations and operations to the XOR gate 110, referring to FIG. 3. That is, the truth table of the XOR gate 410 may be expressed as in Table 1. The XOR gate 410 may perform an XOR operation on the output (i.e., signal RST_2) of the deglitch circuit 420 and the signal MEM_TEST and may output the signal RST_1.

The deglitch circuit 420 may filter a glitch component from the signal RST. That is, the signal RST_2 may be a signal generated by removing the glitch component from the signal RST. The glitch component may include at least one of the rising glitch and the falling glitch.

The deglitch circuit 420 may include a delay cell and a logic gate. The delay cell may be realized with an inverter chain and/or an RC delay circuit.

A configuration and an operation of the deglitch circuit 420 will be described later with reference to FIG. 5 to FIG. 11.

The memory test circuit 400 includes the deglitch circuit 420 to thus prevent erroneous operations of the semiconductor device 5 caused by the glitch component of the signal RST. The semiconductor device 5 may be operated according to the logic level output by the memory test circuit 400, to which the content described with reference to FIG. 3 may be identically applied.

Figure 5:
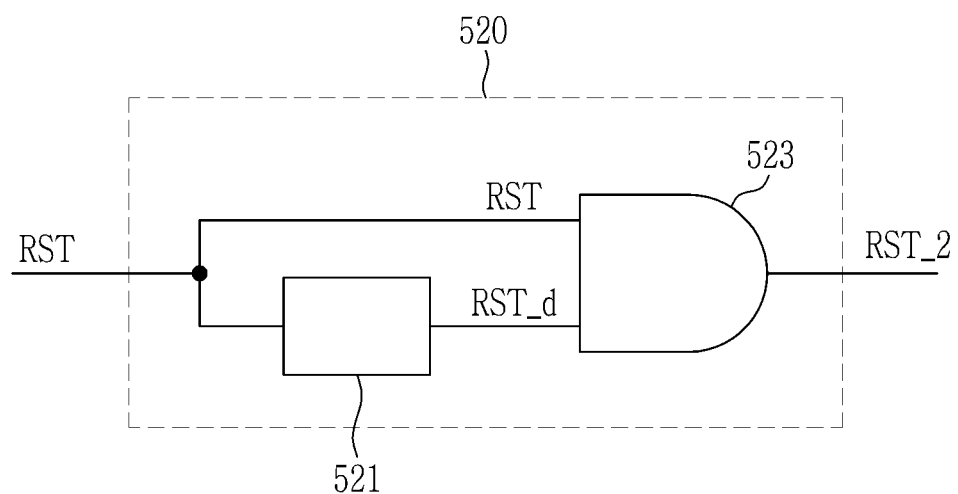
FIG. 5 shows a circuit diagram of a deglitch circuit according to an embodiment.
Figure 6:
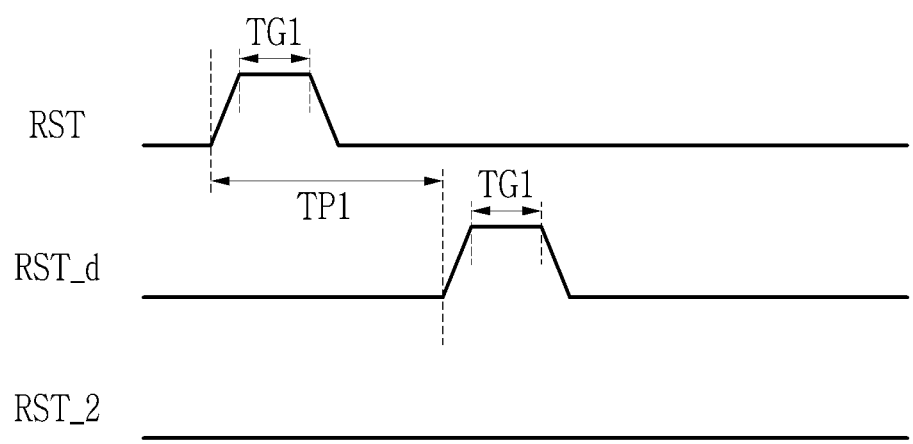
FIG. 6 shows a timing diagram of an input signal and an output signal of a deglitch circuit according to an embodiment.

FIG. 5 shows a circuit diagram of a deglitch circuit according to an embodiment, and FIG. 6 shows a timing diagram of an input signal and an output signal of a deglitch circuit according to an embodiment.

Referring to FIG. 5 and FIG. 6, the deglitch circuit 520 may include a delay cell 521 and an AND gate 523.

The signal RST may be divided and may be input to the delay cell 521 and the AND gate 523.

The delay cell 521 may receive the signal RST. The signal RST may include the rising glitch. The delay cell 521 may delay the signal RST by a time TP1 and may output a signal RST_d. In this instance, the time TP1 may be longer than a duration time TG1 of the rising glitch. The delay cell 521 may be realized with an inverter chain and/or an RC delay circuit. The delay cell 521 may output the signal RST_d to the AND gate 523. The delay cell 521 will be described later with reference to FIG. 9 to FIG. 11.

The AND gate 523 may perform an AND operation on the logic level of the signal RST and the logic level of the signal RST_d and may output the signal RST_2. The signal RST_2 may be a signal generated by removing the rising glitch from the signal RST.

That is, the deglitch circuit 520 may remove the rising glitch of the signal RST.

Figure 7:
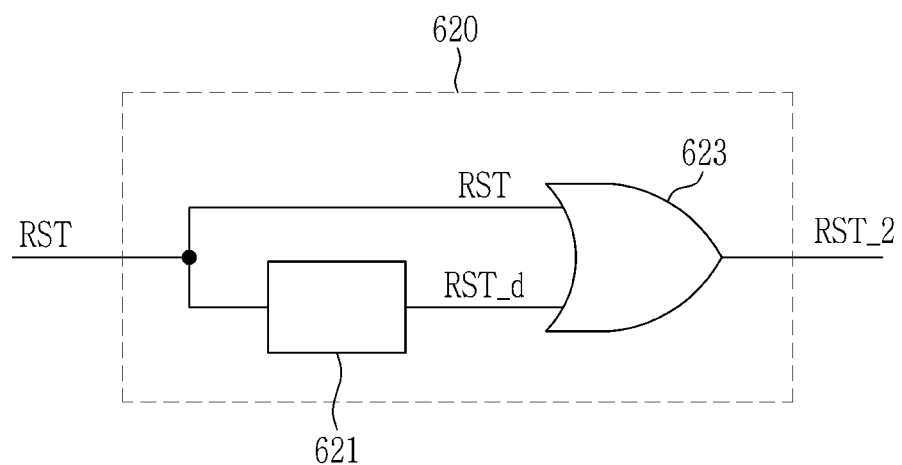
FIG. 7 shows a circuit diagram of a deglitch circuit according to an embodiment.
Figure 8:
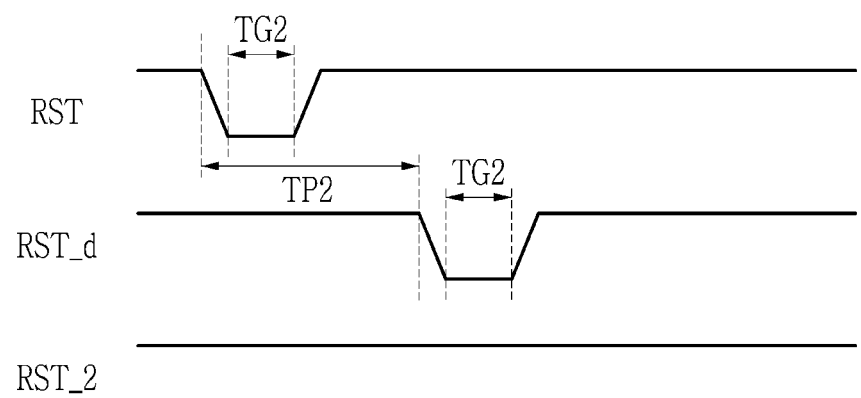
FIG. 8 shows a timing diagram of an input signal and an output signal of a deglitch circuit according to an embodiment.

FIG. 7 shows a circuit diagram of a deglitch circuit according to an embodiment, and FIG. 8 shows a timing diagram of an input signal and an output signal of a deglitch circuit according to an embodiment.

Referring to FIG. 7 and FIG. 8, the deglitch circuit 620 may include a delay cell 621 and an OR gate 623.

The signal RST may be divided and may be input to the delay cell 621 and the OR gate 623.

The delay cell 621 may receive the signal RST. The signal RST may include the falling glitch. The delay cell 621 may delay the signal RST by a time TP2 and may output the signal RST_d. Here, the time TP2 may be longer than a duration time TG2 of the falling glitch. The delay cell 621 may be realized with an inverter chain and/or an RC delay circuit. The delay cell 621 may output the signal RST_d to the OR gate 623. The delay cell 621 will be described later with reference to FIG. 9 to FIG. 11.

The OR gate 623 may perform an OR operation on the logic level of the signal RST and the logic level of the signal RST_d and may output the signal RST_2. The signal RST_2 may be generated by removing the falling glitch from the signal RST.

That is, the deglitch circuit 620 may remove the falling glitch of the signal RST.

FIG. 5 to FIG. 8 have shown the deglitch circuit 520 for removing the rising glitch and the deglitch circuit 620 for removing the falling glitch. Without being limited thereto, the deglitch circuit for removing the rising glitch and the falling glitch may be realized by combining and modifying circuits in many ways.

Figure 9:
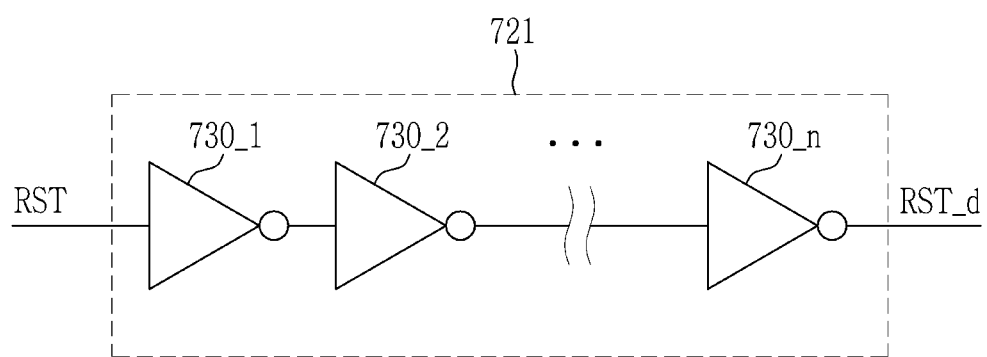
FIG. 9 shows a circuit diagram of a delay cell according to an embodiment.

FIG. 9 shows a circuit diagram of a delay cell according to an emodiment.

Referring to FIG. 9, the delay cell 721 may be realized with an inverter chain. The delay cell 721 may receive the signal RST. The delay cell 721 may delay the signal RST and may output the signal RST_d.

The delay cell 721 may include a plurality of inverters 730_1 to 730_n. The respective inverters 730_1 to 730_n may delay input signals by a predetermined time. The number of the inverters 730_1 to 730_n may be even. That is, n may be an even number that is greater than 1. The number n may be determined based on the duration time of the glitch component. The number n may be determined so that the time delayed by the inverters 730_1 to 730_n may be longer than the duration time of the glitch component.

Figure 10:
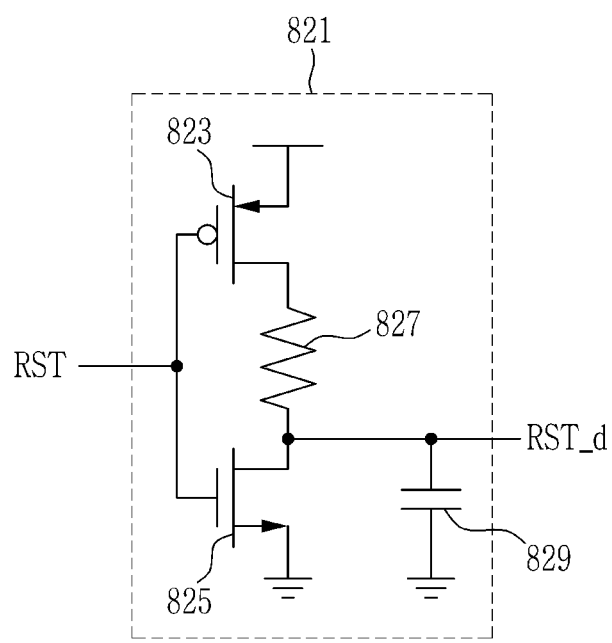
FIG. 10 shows a circuit diagram of a delay cell according to an embodiment.

FIG. 10 shows a circuit diagram of a delay cell according to an embodiment.

Referring to FIG. 10, the delay cell 821 may be realized with an RC delay circuit. The delay cell 821 may receive the signal RST. The delay cell 821 may delay the signal RST and may output the signal RST_d.

The delay cell 821 may include transistors 823 and 825, a resistor 827, and a capacitor 829. The transistor 823 and the transistor 825 may be different from each other. The transistor 823 may be a p-channel metal oxide semiconductor (PMOS), the transistor 825 may be an n-channel metal oxide semiconductor (NMOS), and the transistors 823 and 825 may form a complementary metal oxide semiconductor (CMOS).

The delay cell 821 may delay the signal RST according to a product of resistance of the resistor 827 and capacitance of the capacitor 829. The resistance of the resistor 827 and the capacitance of the capacitor 829 may be determined so that the delay time of the signal RST may be longer than the duration time of the glitch component.

Figure 11:
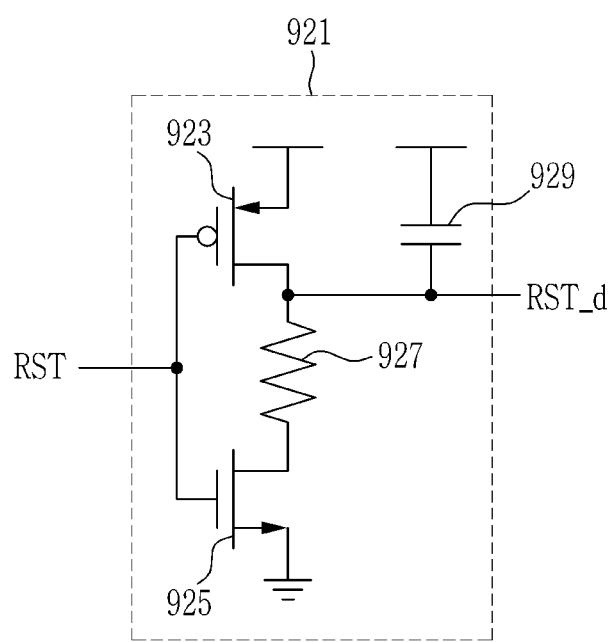
FIG. 11 shows a circuit diagram of a delay cell according to an embodiment.

FIG. 11 shows a circuit diagram of a delay cell according to an embodiment.

Referring to FIG. 11, the delay cell 921 may be realized with an RC delay circuit. The delay cell 921 may receive the signal RST. The delay cell 921 may delay the signal RST and may output the signal RST_d.

The delay cell 921 may include transistors 923 and 925, a resistor 927, and a capacitor 929. The transistor 923 and the transistor 925 may be different from each other. The transistor 923 may be a PMOS, the transistor 925 may be an NMOS, and the transistors 923 and 925 may form a CMOS.

The delay cell 921 may delay the signal RST according to a product of resistance of the resistor 927 and capacitance of the capacitor 929. The resistance of the resistor 927 and the capacitance of the capacitor 929 may be determined so that the delay time of the signal RST may be longer than the duration time of the glitch component.

Figure 12:
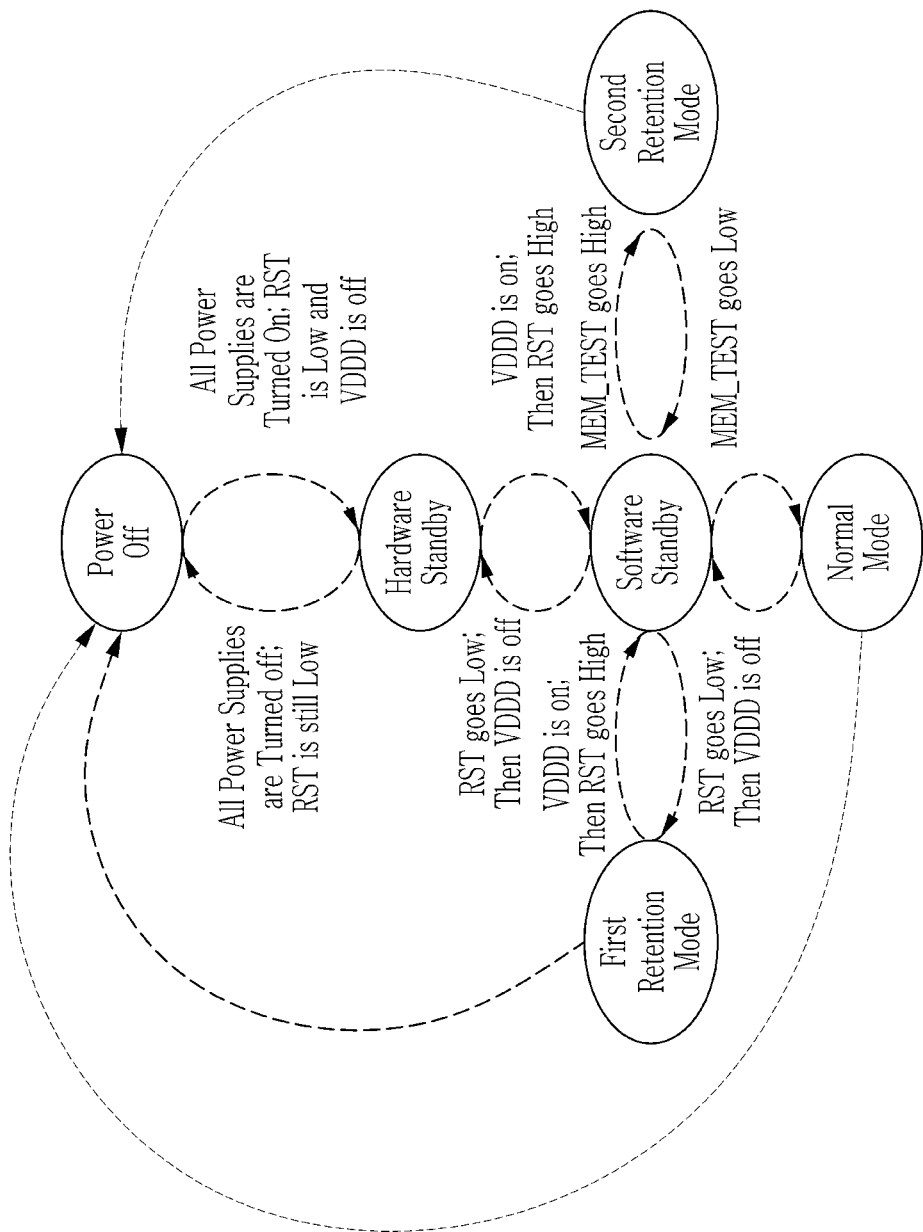
FIG. 12 shows an operation of a semiconductor device according to an embodiment.

FIG. 12 shows an operation of a semiconductor device according to an embodiment.

Referring to FIG. 12, the semiconductor device 5 may be manufactured in the factory and may then be operated to test retention of the memory device 200 before its ordinary use.

The semiconductor device 5 may be in a hardware standby state when it is powered off. For example, as the semiconductor device 5 is powered on, the semiconductor device 5 may transition to the hardware standby state. In this instance, the signal RST output by the host 10 and instructing the memory device 200 to be operated may be low level and no voltage VDDD may be supplied.

In the hardware standby state, as the semiconductor device 5 is powered off, the semiconductor device 5 may transition to a power off state. Here, the signal RST may be low level.

In the hardware standby state, when the voltage VDDD is supplied, the signal RST may become high level and the semiconductor device 5 may transition to a software standby state. The software standby state may represent a state in which the semiconductor device 5 is ready for communication. Therefore, the semiconductor device 5 may perform a retention test using the BIST logic in the software standby state.

In the software standby state, when the signal RST becomes low level, the voltage VDDD may not be supplied and the semiconductor device 5 may transition to the hardware standby state. For example, the semiconductor device 5 may be switched to the hardware standby state from the software standby state to be powered off.

In the software standby state, the semiconductor device 5 may be operable in the first retention mode, the second retention mode, or the normal mode. In the first retention mode, the second retention mode, or the normal mode, the semiconductor device 5 may be switched to the power off state or may be in the software standby state to perform a next operation.

In detail, in the software standby state, when the BIST logic of the test logic 300 starts a BIST vector for a test, the signal MEM_TEST may become high level. When the signal MEM_TEST becomes high level, the semiconductor device 5 may be in the second retention mode and the test logic 300 may perform a retention test. The test logic 300 may include the BIST logic. When the signal MEM_TEST becomes low level while testing retention of the test logic 300, the semiconductor device 5 may be transition to the software standby state.

When testing retention of the memory device 200 is finished, the semiconductor device 5 may be turned off or may be selectively operable in the normal mode or the first retention mode in the ordinary use.

For example, in the software standby state, when the signal RST becomes low level, the voltage VDDD may not be supplied, the semiconductor device 5 may be transition to the first retention mode and the memory device 200 may retain written data.

Further, in the software standby state, the semiconductor device 5 may be operated in the normal mode in which the constituent elements of the semiconductor device 5 are operated according to an instruction of the host 10.

Figure 13:
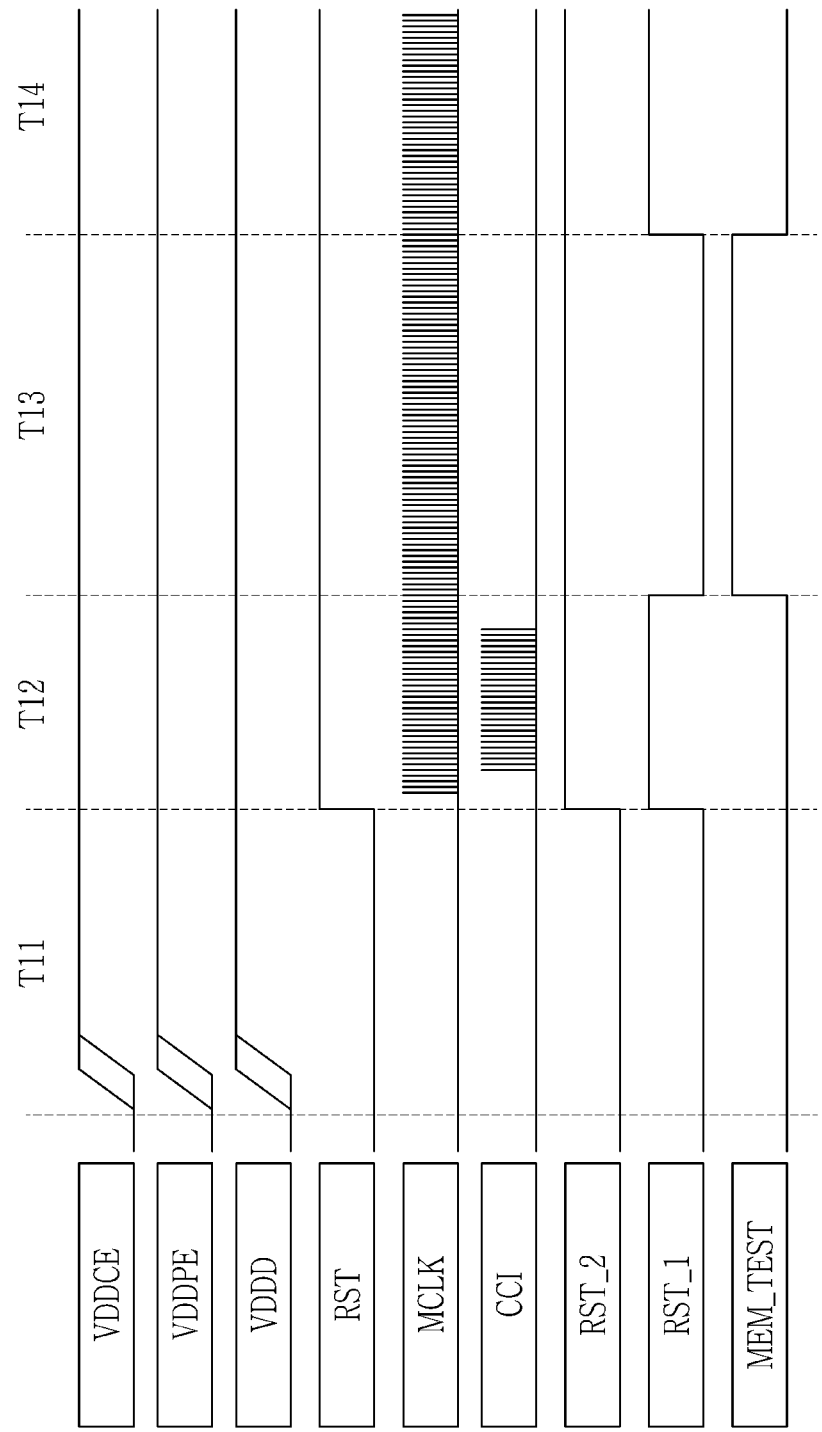
FIG. 13 shows a timing diagram of an operation of a semiconductor device according to an embodiment.

FIG. 13 shows a timing diagram of an operation of a semiconductor device according to an embodiment.

Referring to FIG. 13, the semiconductor device 5 may be operable to test retention of the memory device 200. The semiconductor device 5 may be operable by using the voltages VDDCE, VDDPE, and VDDD and the signals RST, MCLK, CCI, RST_1, RST_2, and MEM_TEST.

The voltage VDDCE drives the memory test circuit 100 and the memory cell array 210 of the memory device 200, the voltage VDDPE drives the peripheral circuit 220 of the memory device 200, and the voltage VDDD drives the test logic 300.

The signal RST may be output by the host 10 to the memory test circuit 100 for the purpose of an operation (e.g., first retention mode, second retention mode, or normal mode) of the memory device 200, the signal MCLK may be a clock signal of the memory device 200, and the signal CCI may be output by the host 10 to a control module through a camera control interface (CCI). The control module may be operated according to the signal CCI. The control module may control the constituent elements of the semiconductor device 5 according to value acquired from the signal CCI. For example, the control module may allow the test logic 300 to perform a retention test on the memory device 200, may read data from the memory device 200, may write data to the memory device 200, may erase the data of the memory device 200, may operate the camera in a specific mode, or may output images to the display. The signal RST_1 may be output by the memory test circuit 100 to the memory device 200 based on the signals RST and/or MEM_TEST, the signal RST_2 may be output by the memory test circuit 100 to the test logic 300 based on the signals RST and/or MEM_TEST, and the signal MEM_TEST may be input to the memory test circuit 100 for the purpose of testing retention.

The period T11 may be a booting period, the period T12 may be a data write period, the period T13 may be a data retain period, and the period T14 may be a data validate period.

For the period T11, the semiconductor device 5 may be turned on. For the period T11, the PMIC 50 may output the voltages VDDCE, VDDPE, and VDDD. The signals RST, MCLK, CCI, RST_1, RST_2, and MEM_TEST may maintain the low level.

For the period T12, the semiconductor device 5 may be operable in the normal mode. The semiconductor device 5 may write a test pattern for a test to the memory cell array 210 for the period T12. For the period T12, the signal RST may transition to the high level from the low level. The signal RST_2 may transition to the high level from the low level. The signal MEM_TEST may maintain the low level so the signal RST_1 may transition to the high level from the low level. The signal MCLK starts toggling, and the signal CCI may be used for the host 10 to instruct an operation mode of the semiconductor device 5 to the control module. Referring to FIG. 13, the control module may instruct the test logic 300 to perform a retention test.

For the period T13, the semiconductor device 5 is operable in the second retention mode. For the period T13, the memory cell array 210 may retain the data written for the period T12. For the period T13, the signal MEM_TEST may transition to the high level from the low level so the signal RST_1 may transition to the low level from the high level.

For the period T14, the BIST logic may validate the data written to the memory cell array 210. For the period T14, the signal RST_1 may transition to the high level from the low level. The signal MEM_TEST may transition to the low level from the high level. The BIST logic may read the data written to the memory cell array 210. The BIST logic may compare the data written for the period T12 and the data read for the period T14. For example, the BIST logic may determine the memory device 200 to be normal when the written data are identical to the read data. The BIST logic may determine the memory device 200 to have defects when the written data are different from the read data.

When the memory device 200 is determined to have defects, the test logic 300 may use the built-in redundancy analysis (BIRA).

FIG. 13 has shown the configuration that the host 10 outputs signals to the control module through the camera control interface. Without being limited thereto, the host 10 may output signals to modules configuring the semiconductor device 5 by using various types of communication protocols.

Figure 14:
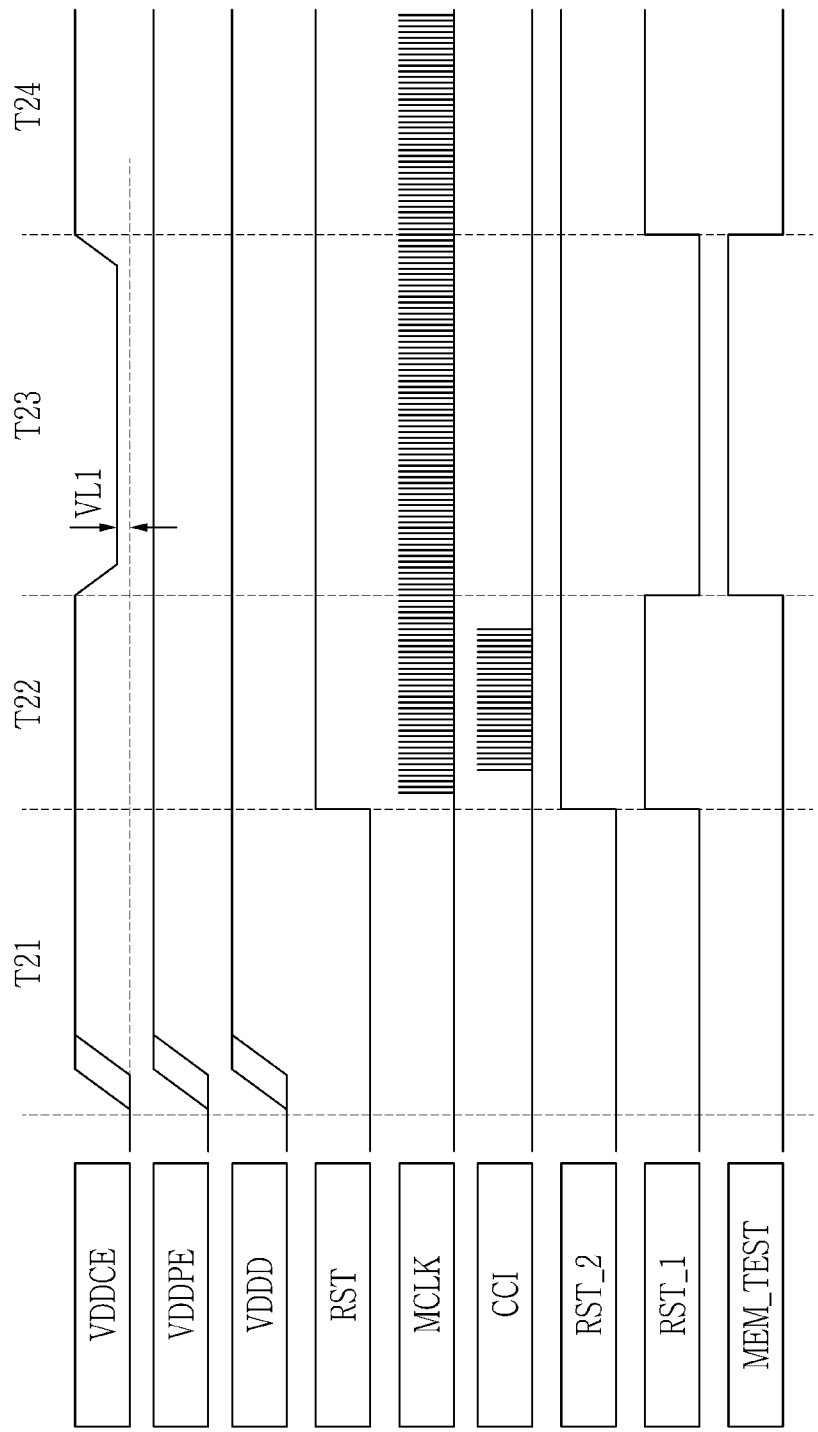
FIG. 14 shows a timing diagram of an operation of a semiconductor device according to an embodiment.

FIG. 14 shows a timing diagram of an operation of a semiconductor device according to an embodiment.

Referring to FIG. 14, the semiconductor device 5 may be operable to test retention of the memory device 200. The semiconductor device 5 may be operated by using the voltages VDDCE, VDDPE, and VDDD and the signals RST, MCLK, CCI, RST_1, RST_2, and MEM_TEST. The content described with reference to FIG. 13 may be identically applied to the voltages VDDCE, VDDPE, and VDDD and the signals RST, MCLK, CCI, RST_1, RST_2, and MEM_TEST.

The period T21 may be the booting period, the period T22 may be the data write period, the period T23 may be the data retain period, and the period T24 may be the data validate period.

For the period T21, the semiconductor device 5 may be turned on. For the period T21, the PMIC 50 may output the voltages VDDCE, VDDPE, and VDDD. The signals RST, MCLK, CCI, RST_1, RST_2, and MEM_TEST may maintain the low level.

For the period T22, the semiconductor device 5 may be operable in the normal mode. The semiconductor device 5 may write a test pattern for a test to the memory cell array 210 for the period T22. For the period T22, the signal RST may transition to the high level from the low level. The signal RST_2 may transition to the high level from the low level. The signal MEM_TEST may maintain the low level so the signal RST_1 may transition to the high level from the low level. The signal MCLK may start toggling, and the signal CCI may be used for the host 10 to instruct the operation mode of the semiconductor device 5 to the control module. Referring to FIG. 14, the control module may instruct the test logic 300 to perform a retention test.

For the period T23, the semiconductor device 5 may be operable in the second retention mode. For the period T23, the memory cell array 210 may retain the data written in the period T22. For the period T23, the signal MEM_TEST may transition to the high level from the low level so the signal RST_1 may transition to the low level from the high level. The voltage VDDCE may be reduced to VL1 in response to the transition of the signal MEM_TEST. The VL1 may be a minimum voltage for driving the memory cell array 210. The voltage VDDCE for driving the memory cell array 210 is reduced in the second retention mode so power consumption of the semiconductor device 5 may be reduced. Selectively, the voltage VDDPE may also be reduced together with the voltage VDDCE.

For the period T24, the test logic 300 may validate the data written to the memory cell array 210. For the period T24, the signal RST_1 may transition to the high level from the low level. The signal MEM_TEST may transition to the low level from the high level. The test logic 300 may read the data written to the memory cell array 210. The test logic 300 may compare the data written in the period T22 and the data read in the period T24. For example, the test logic 300 may determine the memory device 200 to be normal when the read data are identical with the read data. The test logic 300 may determine the memory device 200 to have defects when the written data are different from the read data.

When the memory device 200 is determined to have defects, the test logic 300 may use the built-in redundancy analysis (BIRA).

FIG. 14 has shown the configuration that the host 10 outputs signals to the control module through the camera control interface. Without being limited thereto, the host 10 may output signals to modules configuring the semiconductor device 5 by using various types of communication protocols.

Figure 15:
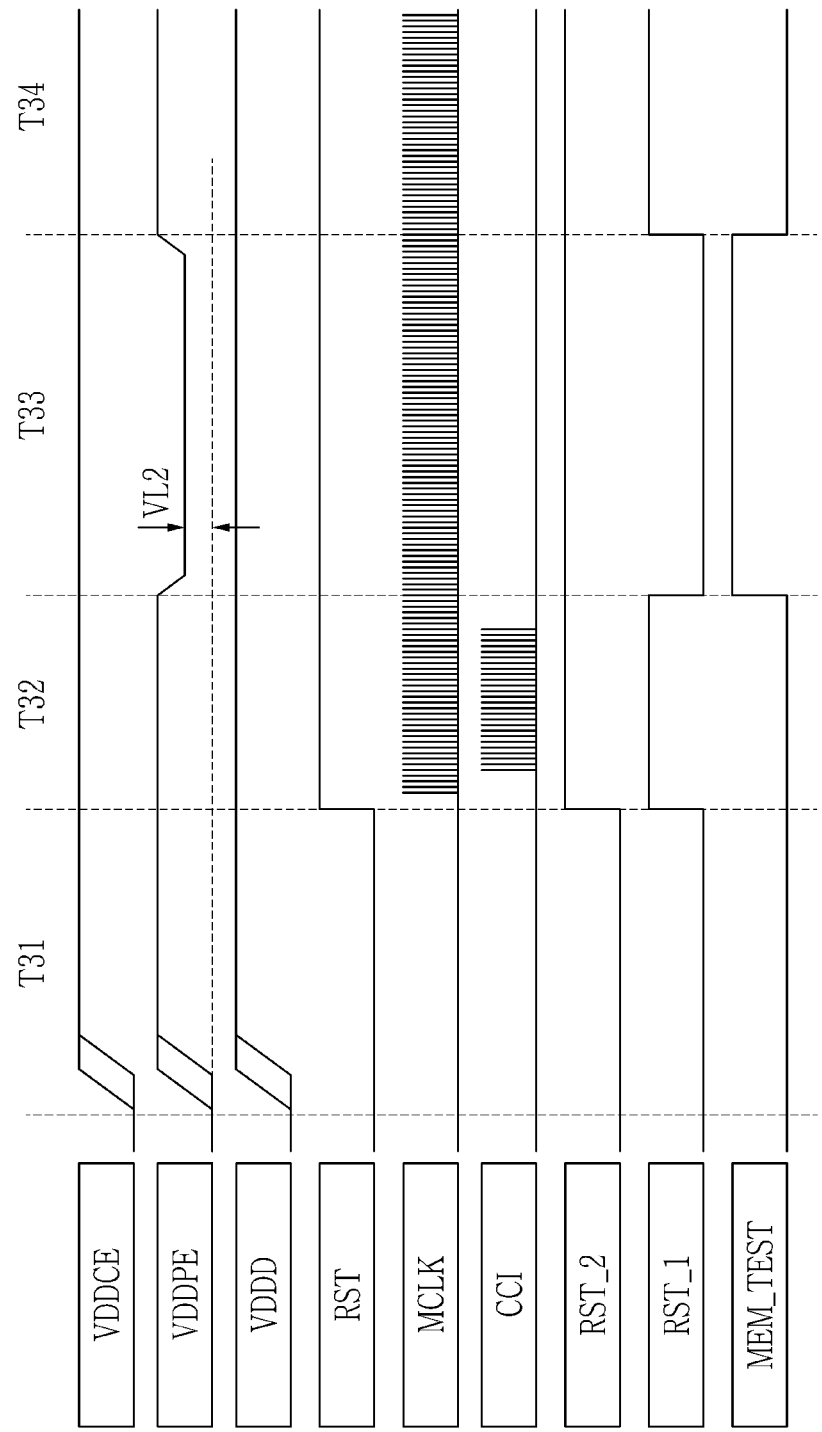
FIG. 15 shows a timing diagram of an operation of a semiconductor device according to an embodiment.

FIG. 15 shows a timing diagram of an operation of a semiconductor device according to an embodiment.

Referring to FIG. 15, the semiconductor device 5 may be operable to test retention of the memory device 200. The semiconductor device 5 may be operable by using the voltages VDDCE, VDDPE, and VDDD and the signals RST, MCLK, CCI, RST_1, RST_2, and MEM_TEST. The content described with reference to FIG. 13 may be identically applied to the voltages VDDCE, VDDPE, and VDDD and the signals RST, MCLK, CCI, RST_1, RST_2, and MEM_TEST.

The period T31 may be the booting period, the period T32 may be the data write period, the period T33 may be the data retain period, and the period T34 may be the data validate period.

For the period T31, the semiconductor device 5 may be turned on. For the period T31, the PMIC 50 may output the voltages VDDCE, VDDPE, and VDDD. The signals RST, MCLK, CCI, RST_1, RST_2, and MEM_TEST may maintain the low level.

For the period T32, the semiconductor device 5 may be operable in the normal mode. The semiconductor device 5 may write a test pattern for a test to the memory cell array 210 for the period T32. For the period T32, the signal RST may transition to the high level from the low level. The signal RST_2 may transition to the high level from the low level. The signal MEM_TEST may maintain the low level so the signal RST_1 may transition to the high level from the low level. The signal MCLK may start toggling, and the signal CCI may be used for the host 10 to instruct the operation mode of the semiconductor device 5 to the control module. Referring to FIG. 15, the control module may instruct the test logic 300 to perform a retention test.

For the period T33, the semiconductor device 5 may be operable in the second retention mode. For the period T33, the memory cell array 210 may retain the data written in the period T32. For the period T33, the signal MEM_TEST may transition to the high level from the low level so the signal RST_1 may transition to the low level from the high level. The voltage VDDPE may be reduced to VL2 in response to the transition of the signal MEM_TEST. The VL2 may be a minimum voltage for driving the peripheral circuit 220. The voltage VDDPE for driving the peripheral circuit 220 is reduced in the second retention mode so power consumption of the semiconductor device 5 may be reduced. Selectively, the voltage VDDCE may also be reduced together with the voltage VDDPE.

For the period T34, the test logic 300 may validate the data written to the memory cell array 210. For the period T34, the signal RST_1 may transition to the high level from the low level. The signal MEM_TEST may transition to the low level from the high level. The test logic 300 may read the data written to the memory cell array 210. The test logic 300 may compare the data written in the period T32 and the data read in the period T34. For example, the test logic 300 may determine the memory device 200 to be normal when the read data are identical with the read data. The test logic 300 may determine memory device 200 to have defects when the written data are different from the read data.

When the memory device 200 is determined to have defects, the test logic 300 may use the built-in redundancy analysis (BIRA).

FIG. 15 has shown the configuration that the host 10 outputs signals to the control module through the camera control interface. Without being limited thereto, the host 10 may output signals to modules configuring the semiconductor device 5 by using various types of communication protocols.

Figure 16:
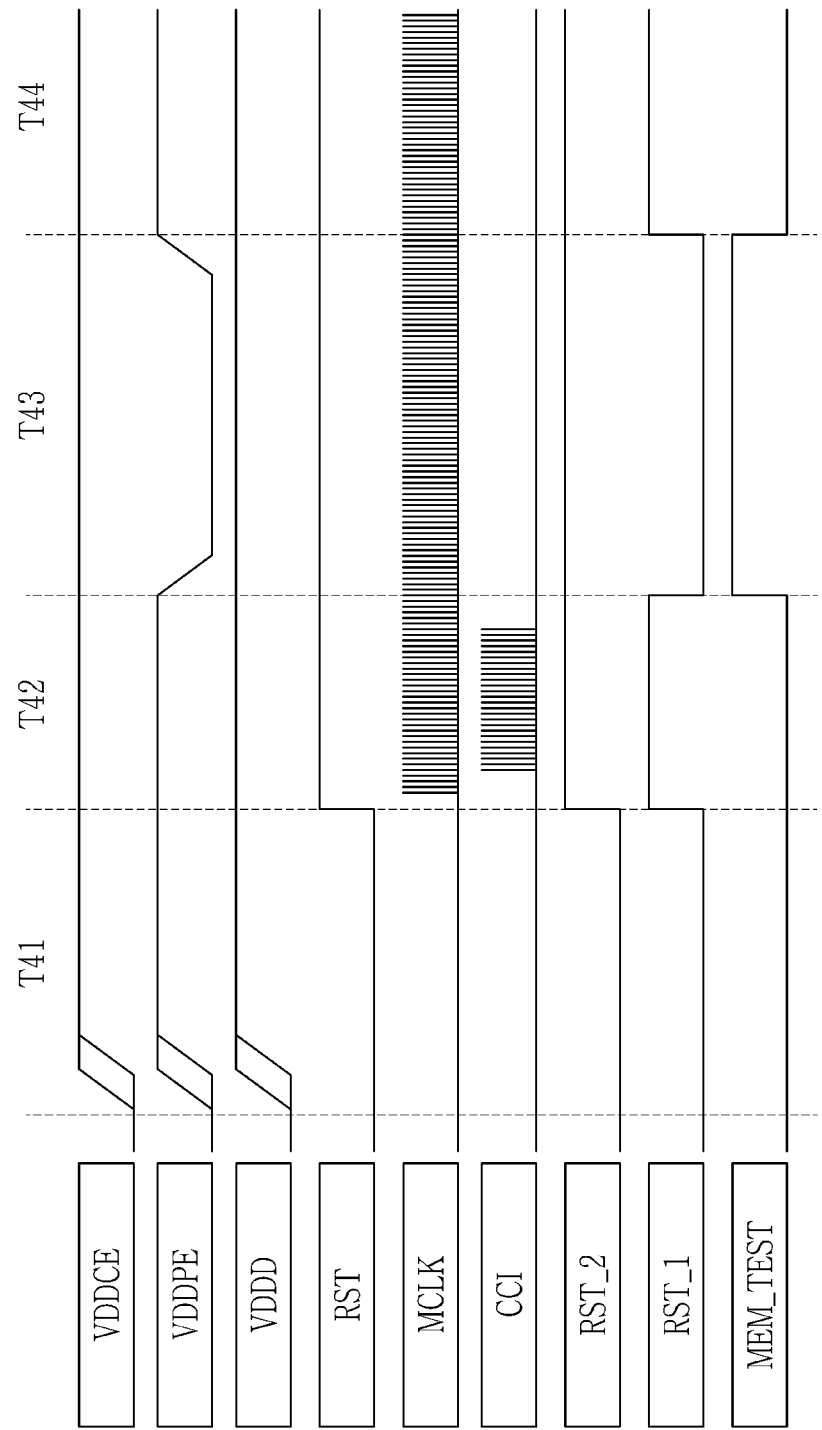
FIG. 16 shows a timing diagram of an operation of a semiconductor device according to an embodiment.

FIG. 16 shows a timing diagram of an operation of a semiconductor device according to an embodiment.

Referring to FIG. 16, the semiconductor device 5 may be operable to test retention of the memory device 200. The semiconductor device 5 may be operable by using the voltages VDDCE, VDDPE, and VDDD and the signals RST, MCLK, CCI, RST_1, RST_2, and MEM_TEST. The content described with reference to FIG. 13 may be identically applied to the voltages VDDCE, VDDPE, and VDDD and the signals RST, MCLK, CCI, RST_1, RST_2, and MEM_TEST.

The period T41 may be the booting period, the period T42 may be the data write period, the period T43 may be the data retain period, and the period T44 may be the data validate period.

For the period T41, the semiconductor device 5 may be turned on. For the period T41, the PMIC 50 may output the voltages VDDCE, VDDPE, and VDDD. The signals RST, MCLK, CCI, RST_1, RST_2, and MEM_TEST may maintain the low level.

For the period T42, the semiconductor device 5 may be operable in the normal mode. The semiconductor device 5 may write a test pattern for a test to the memory cell array 210 for the period T42. For the period T42, the signal RST may transition to the high level from the low level. The signal RST_2 may transition to the high level from the low level. The signal MEM_TEST may maintain the low level so the signal RST_1 may transition to the high level from the low level. The signal MCLK may start toggling, and the signal CCI may be used for the host 10 to instruct the operation mode of the semiconductor device 5 to the control module. Referring to FIG. 16, the control module may instruct the test logic 300 to perform a retention test.

For the period T43, the semiconductor device 5 may be operable in the second retention mode. For the period T43, the memory cell array 210 may retain the data written in the period T42. For the period T43, the signal MEM_TEST may transition to the high level from the low level so the signal RST_1 may transition to the low level from the high level. The voltage VDDPE may be 0 in response to the transition of the signal MEM_TEST. That is, the peripheral circuit 220 may not receive the voltage VDDPE. The peripheral circuit 220 is turned off in the second retention mode so power consumption of the semiconductor device 5 may be reduced. Selectively, the voltage VDDCE may be reduced.

For the period T44, the test logic 300 may validate the data written to the memory cell array 210. For the period T44, the signal RST_1 may transition to the high level from the low level. The signal MEM_TEST may transition to the low level from the high level. The test logic 300 may read the data written to the memory cell array 210. The test logic 300 may compare the data written in the period T42 and the data read in the period T44. For example, the test logic 300 may determine the memory device 200 to be normal when the read data are identical with the read data. The test logic 300 may determine memory device 200 to have defects when the written data are different from the read data.

When the memory device 200 is determined to have defects, the test logic 300 may use the built-in redundancy analysis (BIRA).

FIG. 16 has shown the configuration that the host 10 outputs signals to the control module through the camera control interface. Without being limited thereto, the host 10 may output signals to modules configuring the semiconductor device 5 by using various types of communication protocols.

Figure 17:
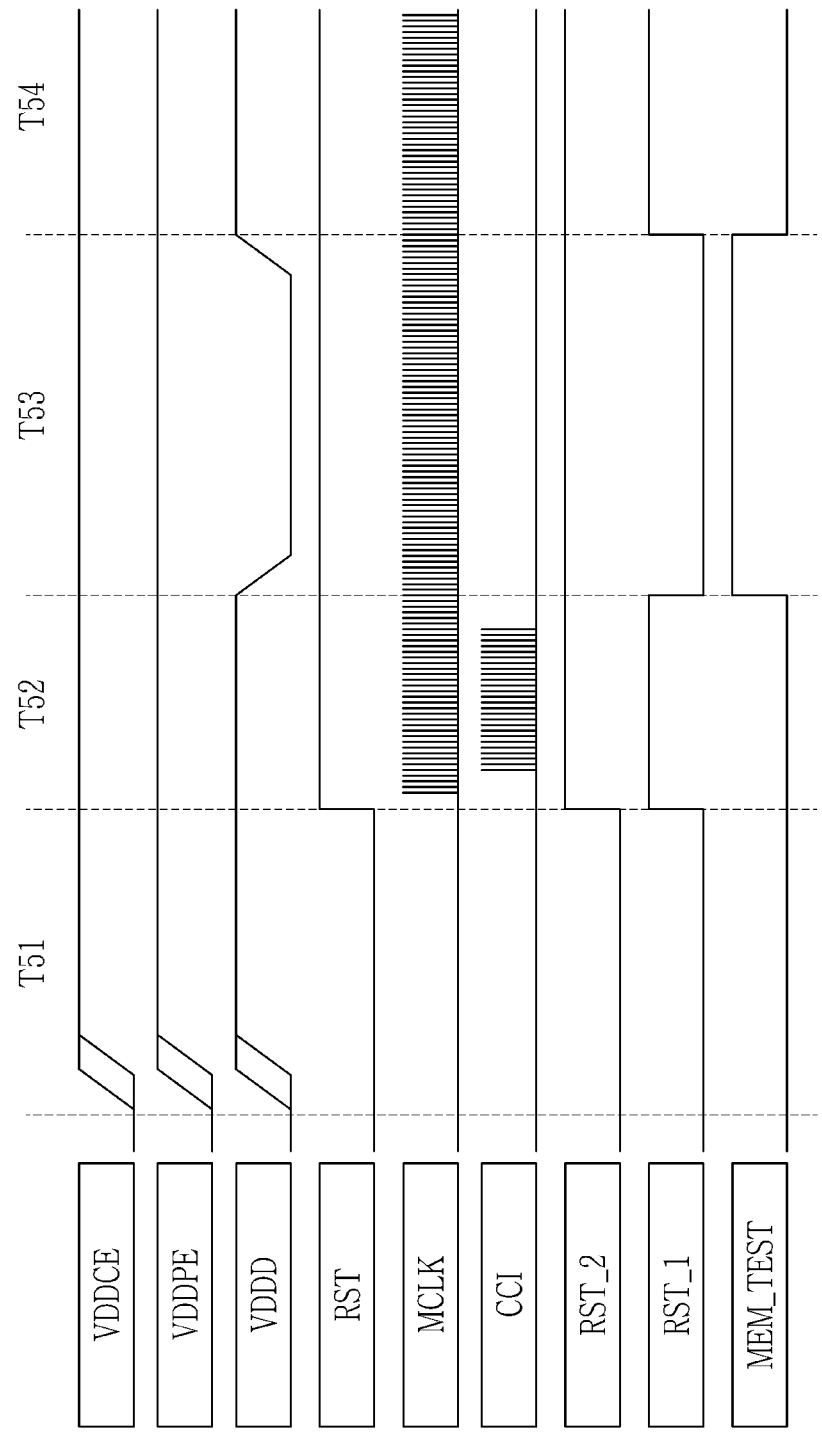
FIG. 17 shows a timing diagram of an operation of a semiconductor device according to an embodiment.

FIG. 17 shows a timing diagram of an operation of a semiconductor device according to an embodiment.

Referring to FIG. 17, the semiconductor device 5 may be operable to test retention of the memory device 200. The semiconductor device 5 may be operated by using the voltages VDDCE, VDDPE, and VDDD and the signals RST, MCLK, CCI, RST_1, RST_2, and MEM_TEST. The content described with reference to FIG. 13 may be identically applied to the voltages VDDCE, VDDPE, and VDDD and the signals RST, MCLK, CCI, RST_1, RST_2, and MEM_TEST.

The period T51 may be the booting period, the period T52 may be the data write period, the period T53 may be the data retain period, and the period T54 may be the data validate period.

For the period T51, the semiconductor device 5 may be turned on. For the period T51, the PMIC 50 may output the voltages VDDCE, VDDPE, and VDDD. The signals RST, MCLK, CCI, RST_1, RST_2, and MEM_TEST may maintain the low level.

For the period T52, the semiconductor device 5 may be operable in the normal mode. The semiconductor device 5 may write a test pattern for a test to the memory cell array 210 for the period T52. For the period T52, the signal RST may transition to the high level from the low level. The signal RST_2 may transition to the high level from the low level. The signal MEM_TEST may maintain the low level so the signal RST_1 may transition to the high level from the low level. The signal MCLK may start toggling, and the signal CCI may be used for the host 10 to instruct the operation mode of the semiconductor device 5 to the control module. Referring to FIG. 17, the control module may instruct the test logic 300 to perform a retention test.

For the period T53, the semiconductor device 5 may be operable in the second retention mode. For the period T53, the memory cell array 210 may retain the data written in the period T52. For the period T53, the signal MEM_TEST may transition to the high level from the low level so the signal RST_1 may transition to the low level from the high level. The voltage VDDD may be 0 in response to the transition of the signal MEM_TEST. In this instance, the test logic 300 may be connected to a voltage VDDCE supply line or a voltage VDDPE supply line. Selectively, at least one of the voltage VDDCE and the voltage VDDPE may be reduced. Hence, power consumption of the semiconductor device 5 may be reduced.

For the period T54, the test logic 300 may validate the data written to the memory cell array 210. For the period T54, the signal RST_1 may transition to the high level from the low level. The signal MEM_TEST may transition to the low level from the high level. The test logic 300 may read the data written to the memory cell array 210. The test logic 300 may compare the data written in the period T52 and the data read in the period T54. For example, the test logic 300 may determine the memory device 200 to be normal when the read data are identical with the read data. The test logic 300 may determine memory device 200 to have defects when the written data are different from the read data.

When the memory device 200 is determined to have defects, the test logic 300 may use the built-in redundancy analysis (BIRA).

FIG. 17 has shown the configuration that the host 10 outputs signals to the control module through the camera control interface, and without being limited thereto, the host 10 may output signals to modules configuring the semiconductor device 5 by using various types of communication protocols.

Figure 18:
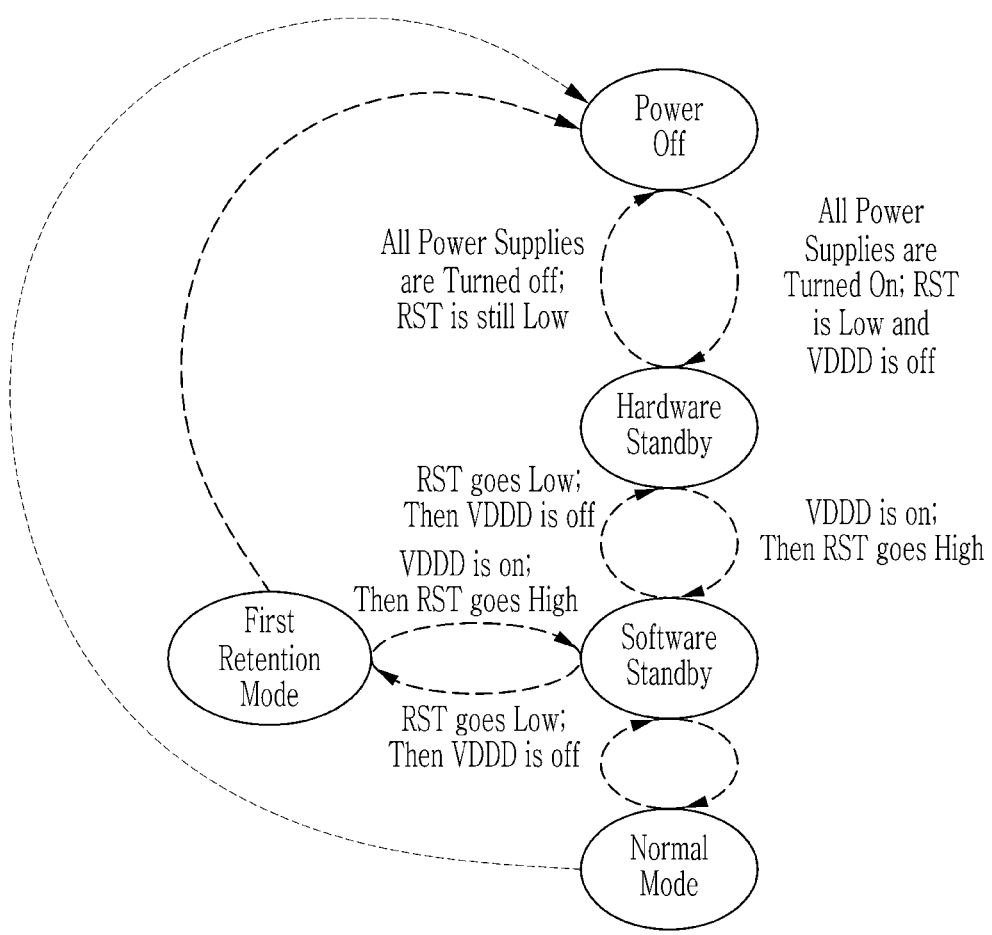
FIG. 18 shows a timing diagram of an operation of a semiconductor device according to an embodiment.

FIG. 18 shows a timing diagram of an operation of a semiconductor device according to an embodiment.

Referring to FIG. 18, the semiconductor device 5 may be selectively operable in the normal mode or the first retention mode in ordinary use.

The semiconductor device 5 may transition to a hardware standby state when it is turned off. For example, when the semiconductor device 5 is turned on, the semiconductor device 5 may transition to the hardware standby state. In this instance, the signal RST output by the host 10 and instructing the memory device 200 to be operated may be the low level, and no voltage VDDD may be supplied.

In the hardware standby state, as the semiconductor device 5 is powered off, the semiconductor device 5 may transition to a power off state. Here, the signal RST may be low level.

In the hardware standby state, when the voltage VDDD is supplied, the signal RST may become high level and the semiconductor device 5 may transition to the software standby state.

In the software standby state, when the signal RST becomes the low level, the voltage VDDD may not be supplied, and the semiconductor device 5 may transition to the hardware standby state. For example, the semiconductor device 5 may be switched to the hardware standby state from the software standby state to be powered off.

In the software standby state, the semiconductor device 5 may be operable in the first retention mode or the normal mode. In the first retention mode or the normal mode, the semiconductor device 5 may be switched to the power off state or to the software standby state so as to perform a next operation.

In the software standby state, the semiconductor device 5 may be operated in the normal mode in which the constituent elements of the semiconductor device 5 are operated according to the instruction of the host 10. For example, in the normal mode, the semiconductor device 5 may write data to the memory device 200. The data may be a set file for various operations (e.g., a photographing operation, an image reproducing operation, etc.) performed by the semiconductor device 5. The set file may include firmware data and tuning data.

In the software standby state, when the signal RST becomes the low level, the voltage VDDD is not supplied, the semiconductor device 5 transitions to the first retention mode so the memory device 200 may retain the written data.

Figure 19:
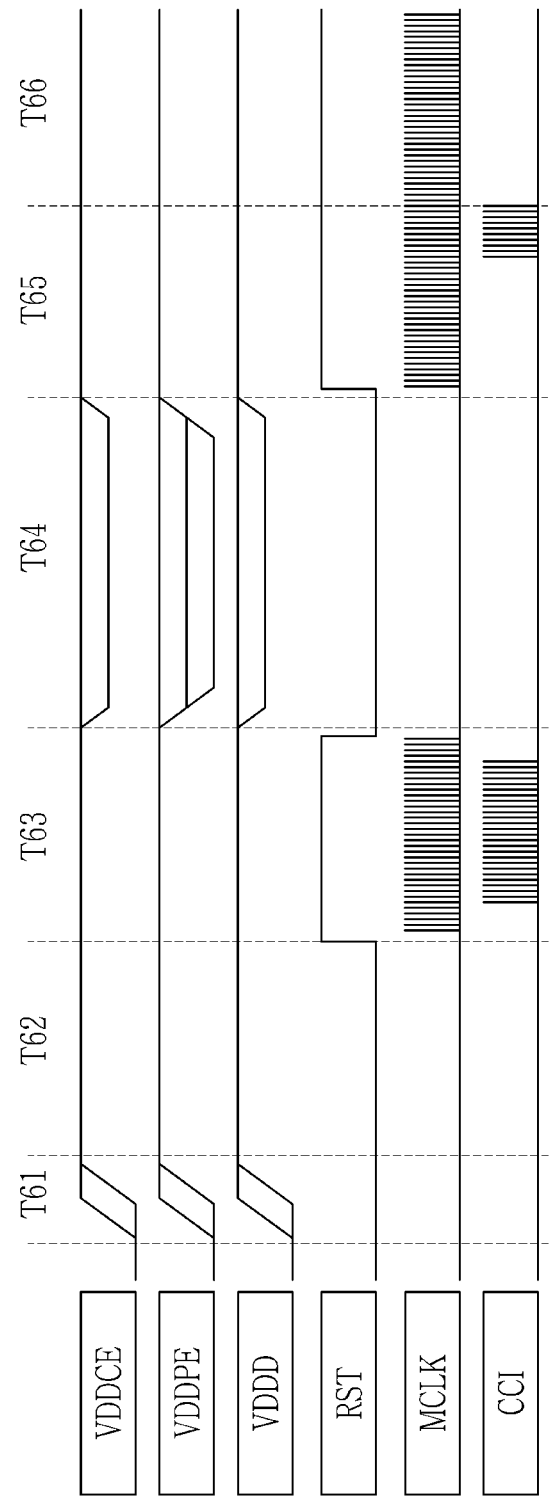
FIG. 19 shows a timing diagram of an operation of a semiconductor device according to an embodiment.

FIG. 19 shows a timing diagram of an operation of a semiconductor device according to an embodiment.

Referring to FIG. 19, the semiconductor device 5 may be selectively operated in the normal mode or the first retention mode by using the memory device 200 when it is turned on in the ordinary use. The semiconductor device may be operable by using the voltages VDDCE, VDDPE, and VDDD and the signals RST, MCLK, and CCI. In the ordinary use, the signal MEM_TEST of FIG. 1 may not be input.

That is, the memory test circuit 100 may bypass the signal RST. In detail, the signal RST_1 and the signal RST_2 described with reference to FIG. 1 may be equal to the signal RST of FIG. 19.

The voltage VDDCE drives the memory test circuit 100 and the memory cell array 210 of the memory device 200, the voltage VDDPE drives the peripheral circuit 220 of the memory device 200, and the voltage VDDD drives the test logic 300.

The signal RST is output by the host 10 to the memory test circuit 100 for the purpose of the operation (e.g., the first retention mode or the normal mode) of the memory device 200, the signal MCLK is the clock signal of the memory device 200, and the signal CCI is output by the host 10 to the control module through the camera control interface CCI.

For the period T61, the semiconductor device 5 may be turned on. For the period T61, the PMIC 50 may output the voltages VDDCE, VDDPE, and VDDD. The signals RST, MCLK, and CCI may maintain the low level.

For the period T62, the semiconductor device 5 may be in the hardware standby state.

For the period T63, the semiconductor device 5 may be in the software standby state. When the signal RST transitions to the high level from the low level, the semiconductor device 5 may be in the software standby state. The semiconductor device 5 may write data to the memory cell array 210 in the software standby state. The data may be a set file for various operations (e.g., a photographing operation, an image reproducing operation, etc.) performed by the semiconductor device 5. The set file may include firmware data and tuning data. The semiconductor device 5 may instruct the control module to write data by using the signal CCI. For the period T63, the signal MCLK may start toggling. At an end of the period T63, the signal RST may transition to the low level from the high level.

For the period T64, the semiconductor device 5 may be operable in the first retention mode. The memory cell array 210 may retain the data written in the period T63.

As the signal RST transitions to the low level from the high level, at least one of the voltages VDDCE, VDDPE, and VDDD may be reduced for the period T64. The signal MCLK may stop toggling. The voltage VDDCE input to the memory test circuit 100 and the memory cell array 210 may maintain the existing voltage or may be reduced. The voltage VDDPE input to the peripheral circuit 220 may maintain the existing voltage, may be reduced, or may become 0. The voltage VDDD input to the test logic 300 may maintain the existing voltage or may be reduced. The above-noted embodiments may be combined and realized in many ways. Accordingly, the semiconductor device 5 may reduce power consumption in the first retention mode.

For the period T65, the semiconductor device 5 may be in the software standby state. For the period T65, when the voltages VDDCE, VDDPE, and VDDD increase to the voltage existing in the period T63, the signal RST may transition to the high level from the low level. The host 10 may instruct the control module to perform a specific operation by using the signal CCI. For example, the host 10 may instruct the control module to take photographs, reproduce images, etc.

The period T66 may be an operation period according to the instruction of the host 10. In response to the instruction of the host 10, the control module may read the set file written to the memory cell array 210 and may drive the module such as a camera. As the memory cell array 210 retains the set file, the semiconductor device 5 may be quickly operated in response to the instruction of the host 10.

FIG. 19 has shown the configuration that the host 10 outputs signals to the control module through the camera control interface. Without being limited thereto, the host 10 may output signals to modules configuring the semiconductor device 5 by using various types of communication protocols.

Figure 20:
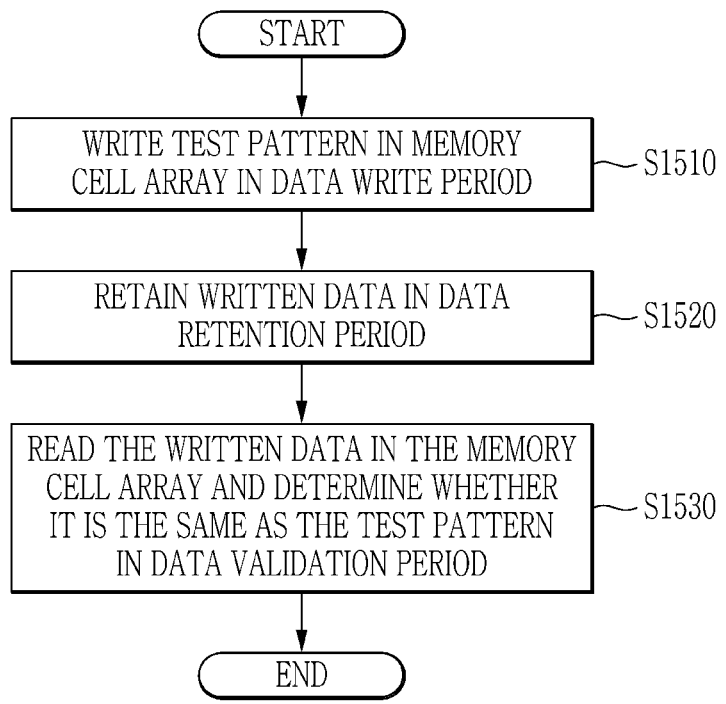
FIG. 20 shows a flowchart of a retention test method according to an embodiment.

FIG. 20 shows a flowchart of a retention test method according to an embodiment.

Referring to FIG. 20, the semiconductor device may write the test pattern to the memory cell array for the data write period (S1510). For example, the semiconductor device may output a high-level signal to the memory device and may output a high-level signal to the test logic for performing a retention test on the memory cell array of the memory device. Hence, the test logic may start a retention test on the memory cell array and a test pattern may be written to the memory cell array.

For the data retain period after the data write period, the memory cell array may retain the written data (S1520). For example, the semiconductor device may output a low-level signal to the memory device and may output a high-level signal to the test logic. The memory device may reduce the voltage input to at least one of the memory cell array and the peripheral circuit configuring the memory device in response to the low-level signal. The memory device may stop the voltage input to the peripheral circuit.

For the data validate period after the data retain period, the test logic may read the data written to the memory cell array and may determine whether the data are identical with the test pattern (S1530). For example, the semiconductor device may output a high-level signal to the memory device and may output a high-level signal to the test logic. The test logic may determine whether the memory device is normal according to a determination result. For example, the test logic may determine the memory device to be normal when the read data are identical with the test pattern and it may determine the memory device to have defects when the read data are different from the test pattern. The test logic may replace the memory cell with defects in the memory device with a redundancy cell.

Figure 21:
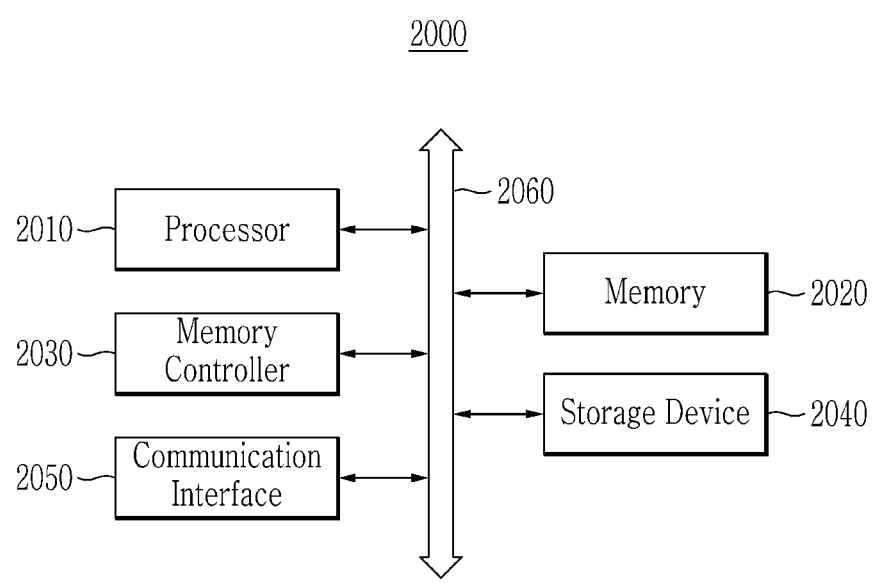
FIG. 21 shows a block diagram of a computing device according to an embodiment.

FIG. 21 shows a block diagram of a computing device according to an embodiment.

Referring to FIG. 21, the computing system 2000 includes a processor 2010, a memory 2020, a memory controller 2030, a storage device 2040, a communication interface 2050, and a bus 2060. The computing system 2000 may further include other general-purpose constituent elements.

The processor 2010 controls overall operations of the respective constituent elements of the computing system 2000. The processor 2010 may be realized with at least one of various processing units such as a central processing unit (CPU), an application processor (AP), or a graphics processing unit (GPU).

The memory 2020 stores various types of data and instructions. The memory 2020 may be realized with the memory device described with reference to FIG. 1 to FIG. 20. The memory controller 2030 controls transmission of data or instructions to/from the memory 2020. The memory controller 2030 may be provided as an individual chip that is not the processor 2010. The memory controller 2030 may be provided as an internal element of the processor 2010.

The storage device 2040 stores programs and data in a non-temporary way. The storage device 2040 may be realized with a non-volatile memory. The communication interface 2050 supports wired/wireless network communication of the computing system 2000. The communication interface 2050 may also support various types of communication in addition to the network communication. The bus 2060 provides a communication function among the constituent elements of the computing system 2000. The bus 2060 may include at least one type of bus according to a communication protocol among the constituent elements.

The respective constituent elements described with reference to FIG. 1 to FIG. 21 or combinations of two or more constituent elements may be realized with a digital circuit, a programmable or non-programmable logic device or array, or an application specific integrated circuit (ASIC).

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A semiconductor device comprising:
   a memory test circuit configured to output a fourth signal having a logic level that is based on:
      a logic level of a second signal corresponding to a first signal output by a host, and
      a logic level of a third signal from a test logic;
   a memory device configured to become active or inactive based on the logic level of the fourth signal; and
   the test logic, wherein the test logic is configured to:
      output the third signal, and
      perform a retention test on the memory device based on the logic level of the second signal.

2. The semiconductor device of claim 1, wherein the memory test circuit includes an exclusive OR (XOR) gate configured to output the fourth signal as an outcome of an XOR operation on the second signal and the third signal.

3. The semiconductor device of claim 1, wherein the memory device is operated in a normal mode in response to a high level of the fourth signal.

4. The semiconductor device of claim 1, wherein the test logic is configured to perform the retention test in response to a high level of the second signal.

5. The semiconductor device of claim 4, wherein the test logic is configured to write data to the memory device as written data in response to the second signal transitioning to the high level from a low level.

6. The semiconductor device of claim 5, wherein the memory test circuit is configured to cause the fourth signal to transition to the high level from the low level in response to a combination of:
   the second signal transitioning to the high level from the low level, and
   the third signal having the low level.

7. The semiconductor device of claim 4, wherein the memory device is configured to retain written data in response to the fourth signal transitioning to a low level from the high level.

8. The semiconductor device of claim 7, wherein the third signal transitions to the high level from the low level in response to a combination of:
   the fourth signal transitioning to the low level from the high level, and
   the second signal having the high level.

9. The semiconductor device of claim 7, further comprising:
   a power source for supplying a voltage to the memory device, wherein
   the power source is configured to reduce the voltage supplied to the memory device in response to the fourth signal transitioning to the low level from the high level.

10. The semiconductor device of claim 9, wherein:
    the memory device includes a memory cell array for retaining data and a peripheral circuit for controlling the memory cell array, and
    the power source is configured to stop supplying the voltage to the peripheral circuit in response to the fourth signal transitioning to the low level from the high level.

11. The semiconductor device of claim 9, wherein:
    the memory device includes a memory cell array for retaining data and a peripheral circuit for controlling the memory cell array, and
    the power source is configured to reduce the voltage supplied to the memory cell array in response to the fourth signal transitioning to the low level from the high level.

12. The semiconductor device of claim 4, wherein the test logic is configured to validate data of the memory device in response to a combination of:
    the third signal transitioning to a low level from the high level, and
    the fourth signal transitioning to the high level from the low level.

13. The semiconductor device of claim 12, wherein the memory test circuit is configured to cause the fourth signal to transition to the high level from the low level in response to a combination of:
    the third signal transitioning to the low level from the high level, and
    the second signal having the high level.

14. The semiconductor device of claim 12, wherein:
    the test logic is configured to determine a successful test of the memory device based on data written to the memory device being identical to data read from the memory device, and the test logic is configured to determine an unsuccessful test of the memory device based on the data written to the memory device being different from the data read from the memory device.

15. The semiconductor device of claim 14, wherein the test logic is configured to replace, in response to determining the unsuccessful test, a memory cell within the memory device having a defect with a redundancy memory cell.

16. The semiconductor device of claim 1, wherein the memory test circuit includes a deglitch circuit configured to remove a glitch component of the first signal to output the second signal.

17. The semiconductor device of claim 1, wherein the second signal is identical to the first signal.

18. A semiconductor device comprising:
a memory device including:
 a memory cell array configured to operate based on a first voltage for a data write period, to operate based on a second voltage that is lower than the first voltage for a data retain period, and to operate based on the first voltage for a data validate period, and
 a peripheral circuit configured to not operate during the data retain period; and
a test logic configured to perform a retention test on the memory cell array for the data write period, the data retain period, and the data validate period.

19. The semiconductor device of claim 18, wherein the test logic is operated based on:
a third voltage for the data write period and the data validate period, and
the second voltage for the data retain period.

20. A method for testing retention comprising:
outputting a first-level signal to a memory device for a data write period, and outputting the first-level signal to a test logic for performing a retention test on a memory cell array of the memory device, to write a test pattern to the memory cell array;

outputting a second-level signal that is different from the first-level signal to the memory device for a data retain period provided after the data write period, and outputting the first-level signal to the test logic to allow the memory cell array to retain written data; and outputting the first-level signal to the memory device for a data validate period provided after the data retain period and outputting the first-level signal to the test logic to allow the test logic to read data written to the memory cell array and determine whether the data are identical with the test pattern.

* * * * *